United States Patent
Nam et al.

(10) Patent No.: US 8,164,497 B2
(45) Date of Patent: Apr. 24, 2012

(54) PIPELINE ANALOG-TO-DIGITAL CONVERTER

(75) Inventors: Jae Won Nam, Daejeon (KR); Young Deuk Jeon, Daejeon (KR); Young Kyun Cho, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 102 days.

(21) Appl. No.: 12/777,910

(22) Filed: May 11, 2010

(65) Prior Publication Data

US 2011/0102220 A1     May 5, 2011

(30) Foreign Application Priority Data

Nov. 5, 2009   (KR) ................... 10-2009-0106571

(51) Int. Cl.
*H03M 1/00* (2006.01)
(52) U.S. Cl. ......... 341/122; 341/155; 341/161; 341/120
(58) Field of Classification Search .......... 341/117–120, 341/155, 161, 122
See application file for complete search history.

(56) References Cited

U.S. PATENT DOCUMENTS

| | | | | |
|---|---|---|---|---|
| 6,057,791 A | * | 5/2000 | Knapp | 341/122 |
| 7,187,310 B2 | * | 3/2007 | El-Sankary et al. | 341/120 |
| 2009/0243900 A1 | * | 10/2009 | Kawahito | 341/118 |

FOREIGN PATENT DOCUMENTS

| | | |
|---|---|---|
| JP | 08-181614 A | 7/1996 |
| KR | 1020060062956 A | 6/2006 |
| KR | 1020080024676 A | 3/2008 |
| KR | 1020090013312 A | 2/2009 |

OTHER PUBLICATIONS

P. Huang et al., "Calibration of sampling clock skew in SHA-less pipeline ADCs," Electronics Letters, Aug. 28, 2008, vol. 44, No. 18.

* cited by examiner

*Primary Examiner* — Jean B Jeanglaude

(57) ABSTRACT

Provided is a pipeline analog-to-digital converter (ADC) without a front-end sample-and-hold amplifier (SHA). To minimize a sampling error occurring between a flash ADC and a multiplying digital-to-analog converter (MDAC) of a first sub-ranging ADC due to removal of a front-end SHA, a delay time of a preamplifier included in the flash ADC is calculated, and the flash ADC samples an analog input signal later by the delay time than the MDAC. Accordingly, the pipeline ADC can minimize a sampling error without using a front-end SHA, and its chip area and power consumption can be reduced.

10 Claims, 5 Drawing Sheets

PIPELINE ANALOG-TO-DIGITAL CONVERTER

CROSS-REFERENCE TO RELATED APPLICATION

This application claims priority to and the benefit of Korean Patent Application No. 10-2009-0106571, filed Nov. 5, 2009, the disclosure of which is incorporated herein by reference in its entirety.

BACKGROUND

1. Field of the Invention

The present invention relates to a pipeline analog-to-digital converter (ADC), and more particularly, to a pipeline ADC that can minimize a sampling error without a front-end sample-and-hold amplifier (SHA).

2. Discussion of Related Art

Video systems such as high-definition televisions (HDTVs) require a high-performance ADC having a high resolution of 12 bits to 14 bits and a high sampling rate of tens of MHz.

Various known ADCs employ a pipeline structure to meet the requirements of high-speed signal processing and high resolution.

FIG. 1 is a block diagram of a conventional pipeline ADC 100, and FIG. 2 is a block diagram of a first sub-ranging ADC $ADC_1$ shown in FIG. 1.

Referring to FIG. 1, the conventional pipeline ADC 100 includes a front-end SHA 110 that samples and holds an analog input signal Vin, first to K-th (where K is an integer equal to or larger than 2) sub-ranging ADCs $ADC_1$, $ADC_2$, ..., $ADC_K$ that digitize parts of the analog input signal Vin in sequence, a digital correction circuit 140 that corrects digital codes output from the respective sub-ranging ADCs $ADC_1$, $ADC_2$, ..., $ADC_K$ and outputs a final N-bit digital code, and a clock signal generator 150 that provides first and second clock signals Q1 and Q2 to the respective sub-ranging ADCs $ADC_1$, $ADC_2$, ..., $ADC_K$.

Referring to FIG. 2, the first sub-ranging ADC $ADC_1$ includes a flash ADC 120 that digitizes a part of the analog input signal Vin and outputs digital codes, and a multiplying digital-to-analog converter (MDAC) 130 that amplifies a residue voltage that remains after the part of the analog input signal Vin is digitized by the flash ADC 120 and outputs the amplified residue voltage. The flash ADC 120 includes a sample/hold (S/H) 121, a plurality of preamplifiers 123, and plurality of latches 125, and the MDAC 130 includes an S/H 131, an adder 133, a residue voltage amplifier 135, and a DAC 137. Here, the S/H 121, 131 are passive sampling RC-networks including a plurality of switched-capacitors, respectively.

In the pipeline ADC 100 having the above-mentioned structure, the front-end SHA 110 samples an input signal during a half cycle of an operation clock, holds the sampled input signal during the other half cycle, and simultaneously provides the sampled input signal to the flash ADC 120 and the MDAC 130 of the first sub-ranging ADC $ADC_1$, thereby minimizing a sampling error that may occur between the two blocks.

However, the front-end SHA 110 is an active sampling circuit including one amplifier and a plurality of switched-capacitors, and thus consumes more power with increase in the operating speed and resolution of the pipeline ADC 100. Also, the area of the ADC 100 increases due to the multiple capacitors included in the SHA 110. Furthermore, since the front-end SHA 110 is disposed at the front end of the pipeline ADC 100, noise and the non-linear characteristic of the multiple capacitors and amplifier included in the front-end SHA 110 may deteriorate performance of the entire pipeline ADC 100.

To reduce the power consumption and area, the front-end SHA 110 may be removed. In this case, however, points in time where the flash ADC 120 and the MDAC 130 of the first sub-ranging ADC $ADC_1$ sample the analog input signal Vin become different from each other. Thus, it cannot be ensured that the flash ADC 120 and the MDAC 130 sample the same value, that is, a serious sampling error may occur between the flash ADC 120 and the MDAC 130.

SUMMARY OF THE INVENTION

The present invention is directed to a pipeline analog-to-digital converter (ADC) that can minimize a sampling error without a front-end sample-and-hold amplifier (SHA).

One aspect of the present invention provides a pipeline ADC including: first to K-th sub-ranging ADCs for sequentially digitizing parts of an analog input signal and outputting digital codes; a digital correction circuit for correcting the digital codes output from the first to K-th sub-ranging ADCs and outputting a final N-bit digital code; a clock signal generator for providing first and second clock signals to the first to K-th sub-ranging ADCs; and a sampling error reducer for reducing a sampling error of the first sub-ranging ADC.

The first sub-ranging ADC may include: a flash ADC for digitizing a part of the analog input signal and outputting digital codes, and including a sample/hold (S/H), a plurality of preamplifiers, and a plurality of latches; and a multiplying digital-to-analog converter (MDAC) for amplifying a residue voltage remaining after the part of the analog input signal is digitized by the flash ADC and outputting the amplified residue voltage, and including an adder, a residue voltage amplifier, and a DAC.

The sampling error reducer may include: a clock buffer for receiving the first clock signal from the clock signal generator and storing the first clock signal; a delay calculator for calculating a delay time of the preamplifiers included in the flash ADC using a clock signal output from the clock buffer; a MDAC sampling signal generator for generating a first sampling signal for a sampling operation of the MDAC using the clock signal output from the clock buffer; and a flash ADC sampling signal generator for generating a second sampling signal for a sampling operation of the flash ADC by delaying the clock signal output from the clock buffer for the delay time calculated by the delay calculator.

The S/H included in the MDAC of the first sub-ranging ADC may sample the analog input signal according to the first sampling signal generated by the MDAC sampling signal generator, and the S/H included in the flash ADC of the first sub-ranging ADC may sample the analog input signal after the delay time of the preamplifiers according to the second sampling signal generated by the flash ADC sampling signal generator.

The delay calculator may include: a delay signal generator for generating a delayed clock signal by delaying the clock signal for the delay time of the preamplifiers included in the flash ADC; a time-to-digital converter (TDC) for outputting an M-bit digital code corresponding to a time difference between the clock signal and the delayed clock signal; and a digital-to-time converter (DTC) for receiving the M-bit digital code from the TDC and outputting a delay time corresponding to the M-bit digital code.

The delay signal generator may include: an S/H for sampling and outputting a voltage signal according to the clock signal; a preamplifier for amplifying the signal sampled by the S/H and outputting the clock signal delayed for the delay time due to the amplification; and a latch for receiving the delayed clock signal from the preamplifier and outputting the delayed clock signal. Here, the S/H, the preamplifier, and the latch included in the delay signal generator may have the same characteristics as the S/H, the preamplifiers, and the latches included in the flash ADC. Thus, the delayed clock signal output from the delay signal generator may have the same delay time as the signal output from the flash ADC.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention.

Figure 3:
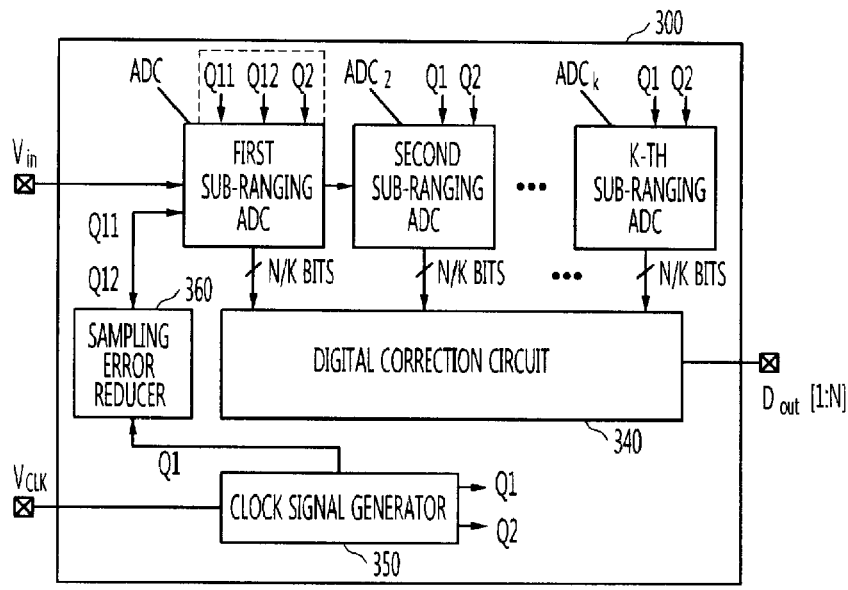
FIG. 3 is a block diagram of a pipeline ADC according to an exemplary embodiment of the present invention.
Figure 4:
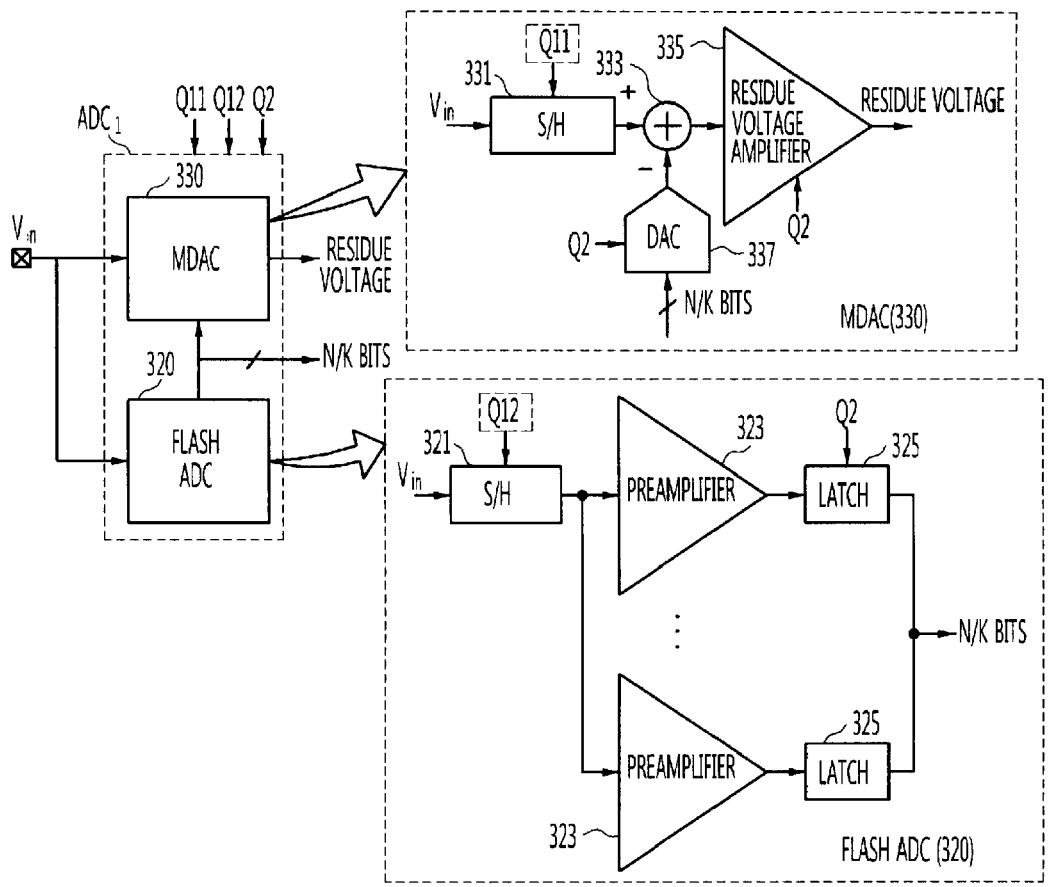
FIG. 4 is a block diagram of a first sub-ranging ADC shown in FIG. 3.

FIG. 3 is a block diagram of a pipeline analog-to-digital converter (ADC) 300 according to an exemplary embodiment of the present invention, and FIG. 4 is a block diagram of a first sub-ranging ADC $ADC_1$ shown in FIG. 3.

Referring to FIG. 3, the pipeline ADC 300 according to an exemplary embodiment of the present invention includes first to K-th sub-ranging ADCs $ADC_1$, $ADC_2$, . . . , $ADC_K$ that sequentially digitize parts of an analog input signal Vin, a digital correction circuit 340 that corrects digital codes output from the respective sub-ranging ADCs $ADC_1$, $ADC_2$, . . . , $ADC_K$ and outputs a final N-bit digital code, a clock signal generator 350 that provides first and second clock signals Q1 and Q2 to each of the sub-ranging ADCs $ADC_1$, $ADC_2$, . . . , $ADC_K$, and a sampling error reducer 360 that reduces a sampling error of the first sub-ranging ADC $ADC_1$.

Referring to FIG. 4, the first sub-ranging ADC $ADC_1$ includes a flash ADC 320 and a multiplying digital-to-analog converter (MDAC) 330. The flash ADC 320 includes a sample/hold (S/H) 321, a plurality of preamplifiers 323, and plurality of latches 325, and the MDAC 330 includes an S/H 331, an adder 333, a residue voltage amplifier 335, and a DAC 337.

Figure 1:
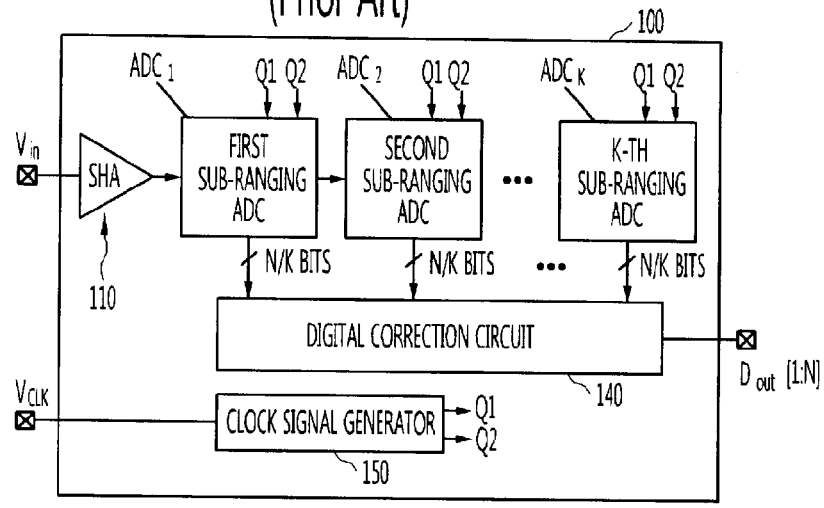
FIG. 1 is a block diagram of a conventional pipeline analog-to-digital converter (ADC)
Figure 2:
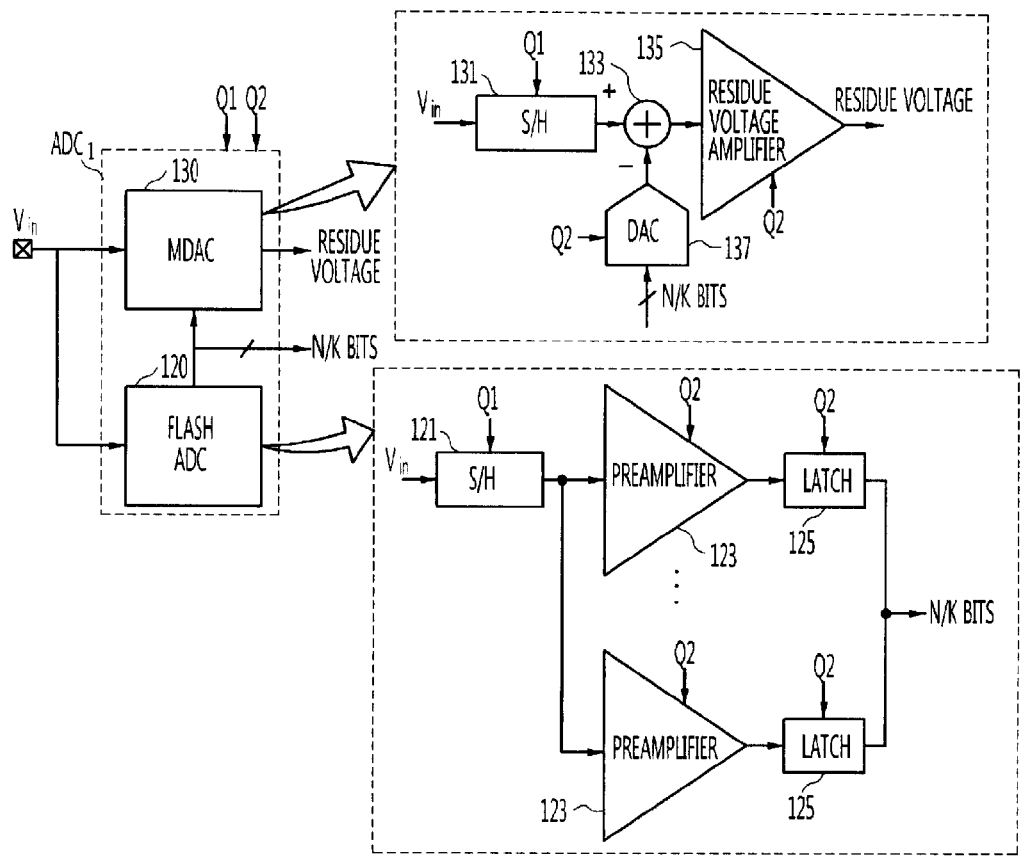
FIG. 2 is a block diagram of a first sub-ranging ADC shown in FIG. 1.

In other words, the pipeline ADC 300 according to an exemplary embodiment of the present invention has the same structure as the conventional pipeline ADC 100 shown in FIG. 1 except that the sampling error reducer 360 is prepared to reduce a sampling error of the first sub-ranging ADC $ADC_1$ occurring due to removal of a front-end sample-and-hold amplifier (SHA).

In the pipeline ADC 300 according to an exemplary embodiment of the present invention, a front-end SHA is removed from its input end, and the analog input signal Vin having a value varying according to time is directly applied to the flash ADC 320 and the MDAC 330 included in the first sub-ranging ADC $ADC_1$.

However, even if the S/H 321 of the flash ADC 320 and the S/H 331 of the MDAC 330 included in the first sub-ranging ADC $ADC_1$ sample the analog input signal Vin at the same point in time, the signal sampled by the S/H 321 of the flash ADC 320 is delayed by the preamplifiers 323. Thus, a serious sampling error occurs between the flash ADC 320 and the MDAC 330.

To minimize such a sampling error between the flash ADC 320 and the MDAC 330, the sampling error reducer 360 causes the S/H 321 of the flash ADC 320 to sample the analog input signal Vin after a delay time of the preamplifiers 323, which will be described in detail below.

Figure 5:
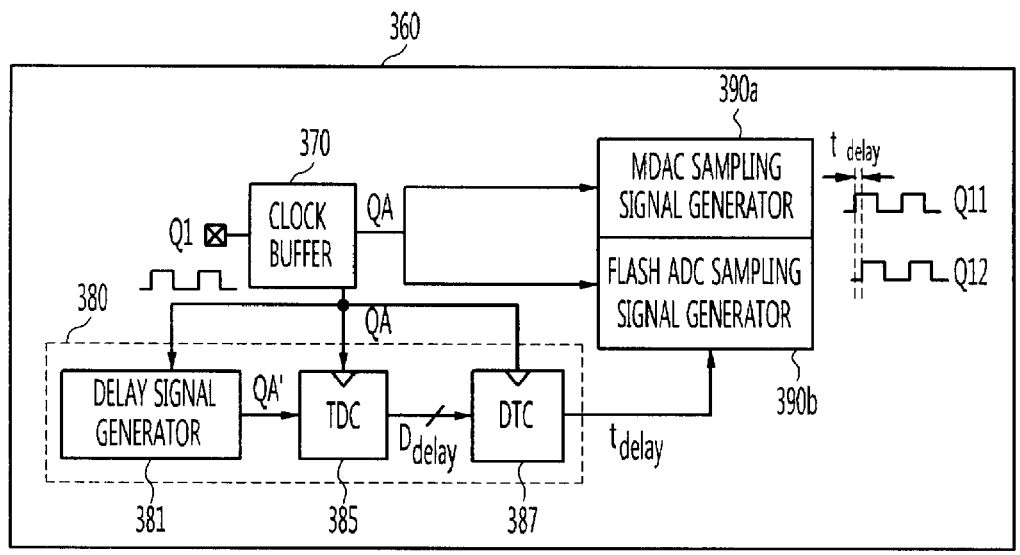
FIG. 5 is a block diagram of a sampling error reducer shown in FIG. 3.

FIG. 5 is a block diagram of the sampling error reducer 360 shown in FIG. 3, and FIGS. 6 to 8 are block diagrams of a delay signal generator 381, a time-to-digital converter (TDC) 385, and a digital-to-time converter (DTC) 387 shown in FIG. 5.

Referring to FIG. 5, the sampling error reducer 360 includes a clock buffer 370 that receives the first clock signal Q1 from the clock signal generator 350 and stores the first clock signal Q1, a delay calculator 380 that calculates a delay time $t_{delay}$ of the preamplifiers 323 included in the flash ADC 320 using a clock signal QA output from the clock buffer 370, a MDAC sampling signal generator 390a that generates a first sampling signal Q11 for a sampling operation of the MDAC 330 using the clock signal QA, and a flash ADC sampling signal generator 390b that generates a second sampling signal Q12 for a sampling operation of the flash ADC 320 by delaying the clock signal QA for the delay time $t_{delay}$ calculated by the delay calculator 380.

Here, the clock signal QA output from the clock buffer 370 is the same as the first clock signal Q1, and is distinguished from the first clock signal Q1 for convenience.

The delay calculator 380 includes the delay signal generator 381 that generates a delayed clock signal QA' by delaying the clock signal QA for the delay time $t_{delay}$ of the flash ADC 320, the TDC 385 that outputs an M-bit digital code $D_{delay}$ corresponding to the time difference $t_{delay}$ between the clock signal QA and the delayed clock signal QA', and the DTC 387 that receives the M-bit digital code $D_{delay}$ from the TDC 385 and outputs the delay time $t_{delay}$ corresponding to the M-bit digital code $D_{delay}$.

Figure 6:
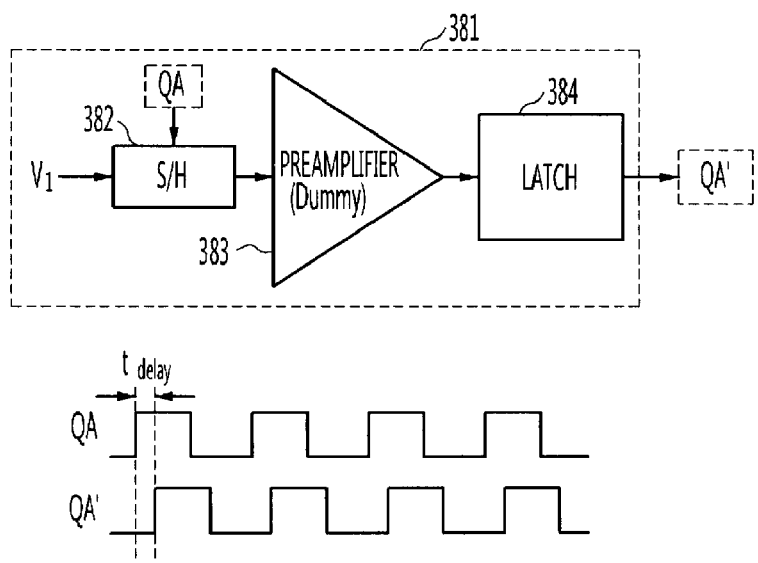
FIG. 6 is a block diagram of a delay signal generator shown in FIG. 5.

Referring to FIG. 6, the delay signal generator 381 includes an S/H 382 that samples and outputs the signal of a first input voltage $V_1$ according to the clock signal QA for the signal output from the S/H 382 having a high level, a preamplifier 383 that amplifies the signal sampled by the S/H 382 and outputs the clock signal QA' delayed for the delay time $t_{delay}$ due to the amplification, and a latch 384 that receives the delayed clock signal QA' from the preamplifier 383 and outputs the delayed clock signal QA'.

Here, the S/H 382, the preamplifier 383, and the latch 384 included in the delay signal generator 381 have the same characteristics as the S/H 321, the preamplifiers 323, and the latches 325 included in the flash ADC 320.

In other words, the delay signal generator 381 has the same structure and characteristics as the flash ADC 320, and the delayed clock signal QA' output from the delay signal generator 381 has the same delay as a signal output from the flash ADC 320.

Figure 7:
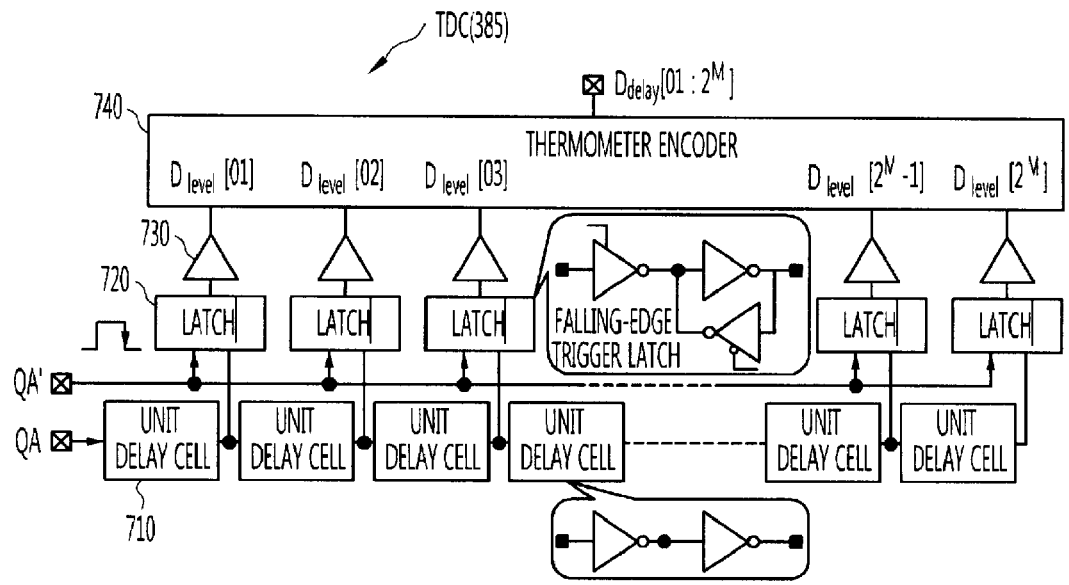
FIGS. 7 and 8 are block diagrams of a time-to-digital converter (TDC) and a digital-to-time converter (DTC) shown in FIG. 5.

Referring to FIG. 7, the TDC 385 has a structure in which a plurality of unit delay cells 710, a plurality of latches 720, and a plurality of buffers 730 are connected to one thermometer encoder 740 in multiple stages. The TDC 385 receives the original clock signal QA and the delayed clock signal QA' and outputs the M-bit digital code $D_{delay}$ corresponding to the time difference $t_{delay}$ between the two clock signals.

The TDC 385, as a device for measuring a time difference between two signals, has the same constitution and operates in the same way as a generally used TDC, and a detailed description of the TDC 385 will be omitted.

Figure 8:
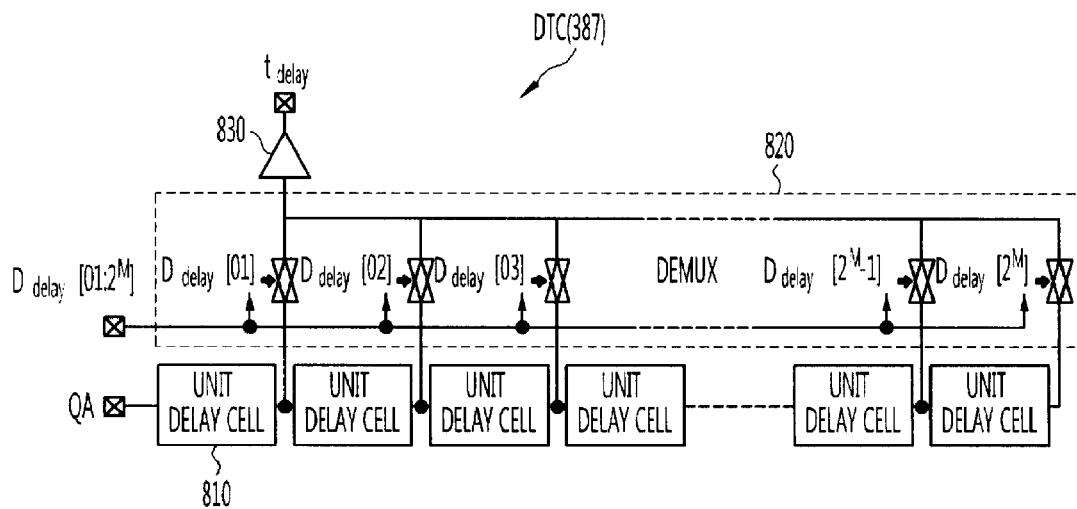

Referring to FIG. 8, the DTC 387 has a structure in which a plurality of unit delay cells 810 are connected to a demultiplexer 830 in multiple stages, and a buffer 830 is connected with an output terminal of the demultiplexer 820. The DTC 387 outputs the time difference $t_{delay}$ corresponding to the M-bit digital code $D_{delay}$ input from the TDC 385.

The DTC 387, as a device for outputting a time corresponding to an input digital code, has the same constitution and operates in the same way as a generally used DTC, and a detailed description of the DTC 387 will be omitted.

Referring back to FIG. 5, the MDAC sampling signal generator 390a generates the first sampling signal Q11 for a sampling operation of the MDAC 330 using the clock signal QA. And, the flash ADC sampling signal generator 390b generates the second sampling signal Q12 for a sampling operation of the flash ADC 320 by delaying the clock signal QA for the delay time $t_{delay}$.

The generated first and second sampling signals Q11 and Q12 are input to the MDAC 330 and the flash ADC 320 included in the first sub-ranging ADC $ADC_1$, respectively, and thus the flash ADC 320 performs the sampling operation later by the delay time $t_{delay}$ than the MDAC 330.

Figure 9:
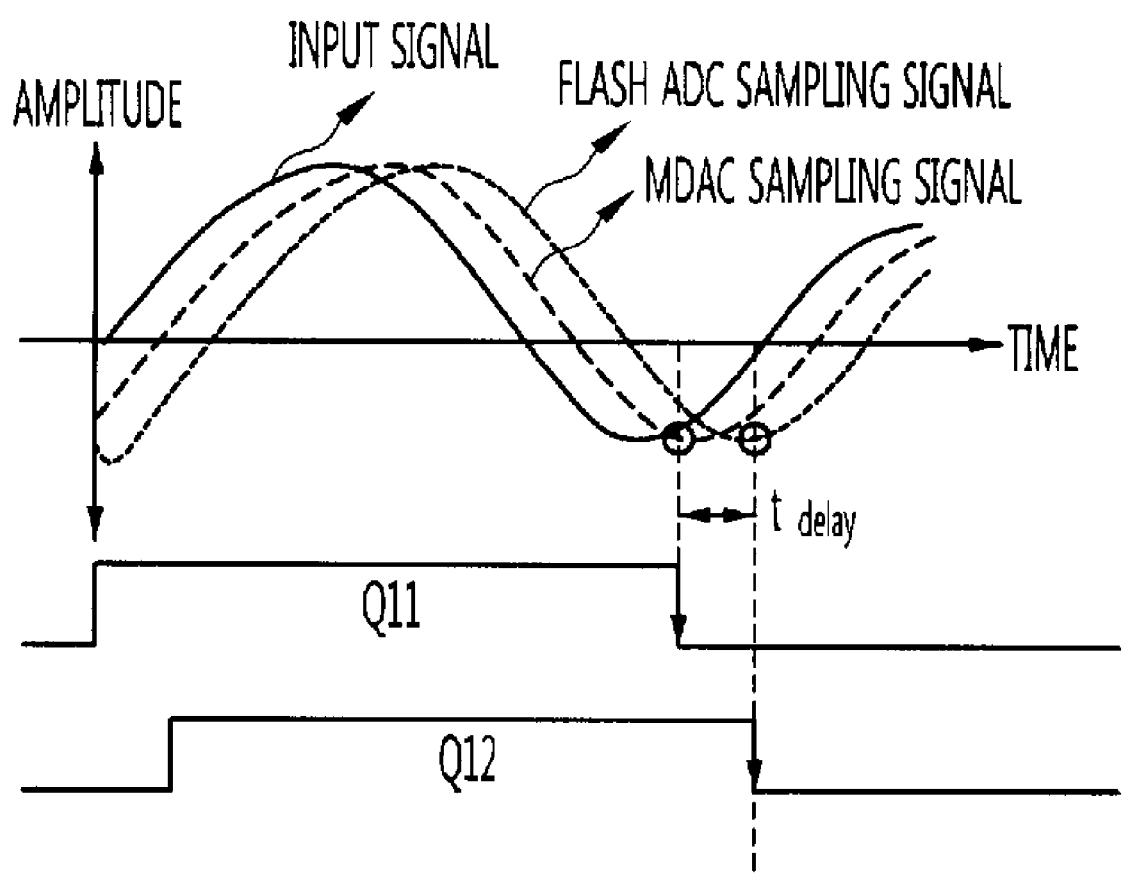
FIG. 9 is a waveform diagram illustrating sampling operations of a flash ADC and a multiplying digital-to-analog converter (MDAC) included in a first sub-ranging ADC of a pipeline ADC according to an exemplary embodiment of the present invention.

FIG. 9 is a waveform diagram illustrating sampling operations of the flash ADC 320 and the MDAC 330 included in the first sub-ranging ADC $ADC_1$ of the pipeline ADC 300 according to an exemplary embodiment of the present invention.

As illustrated in FIG. 9, a sampling time point Q12 of the flash ADC 320 follows a sampling time point Q11 of the MDAC 330 after the delay time $t_{delay}$. Thus, a sampling error between the flash ADC 320 and the MDAC 330 can be minimized without using a front-end SHA.

As described above, the pipeline ADC 300 according to an exemplary embodiment of the present invention does not use a front-end SHA, and thus it is possible to reduce its chip area and power consumption.

According to an exemplary embodiment of the present invention, although a pipeline ADC does not use a front-end SHA, it is possible to minimize a sampling error, and thus it is possible to reduce its chip area and power consumption.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A pipeline analog-to-digital converter (ADC), comprising:
    first to K-th sub-ranging ADCs configured to sequentially digitize parts of an analog input signal and output digital codes;
    a digital correction circuit configured to correct the digital codes output from the first to K-th sub-ranging ADCs and output an N-bit digital code;
    a clock signal generator configured to provide first and second clock signals to the first to K-th sub-ranging ADCs; and
    a sampling error reducer configured to calculate a delay time occurring in the first sub-ranging ADC and control a sampling operation of the first sub-ranging ADC based on the delay time to reduce a sampling error of the first sub-ranging ADC.

2. The pipeline ADC of claim 1, wherein the first sub-ranging ADC includes:
    a flash ADC that is configured to digitize a first part of the analog input signal and output a digital code, and that includes a sample/hold (S/H), a plurality of preamplifiers, and a plurality of latches; and
    a multiplying digital-to-analog converter (MDAC) that is configured to amplify a residue voltage remaining after the first part of the analog input signal is digitized by the flash ADC and output the amplified residue voltage, and that includes an S/H, an adder, a residue voltage amplifier, and a DAC.

3. The pipeline ADC of claim 2, wherein the sampling error reducer includes:
    a clock buffer configured to receive the first clock signal from the clock signal generator and store the first clock signal;
    a delay calculator configured to calculate a first delay time of a preamplifier included in the flash ADC using a clock signal output from the clock buffer, the first delay time corresponding to the delay time;
    a MDAC sampling signal generator configured to generate a first sampling signal for a sampling operation of the MDAC using the clock signal output from the clock buffer; and
    a flash ADC sampling signal generator configured to generate a second sampling signal for a sampling operation of the flash ADC by delaying the clock signal output from the clock buffer by a second delay time corresponding to the first delay time.

4. The pipeline ADC of claim 3, wherein the S/H included in the MDAC of the first sub-ranging ADC is configured to sample the analog input signal in response to the first sampling signal generated by the MDAC sampling signal generator.

5. The pipeline ADC of claim 3, wherein the S/H included in the flash ADC of the first sub-ranging ADC is configured to sample the analog input signal in response to the second sampling signal generated by the flash ADC sampling signal generator.

6. The pipeline ADC of claim 3, wherein the delay calculator includes:
    a delay signal generator configured to generate a delayed clock signal by delaying the clock signal by the first delay time;
    a time-to-digital converter (TDC) configured to output an M-bit digital code corresponding to a time difference between the clock signal and the delayed clock signal; and a digital-to-time converter (DTC) configured to receive the M-bit digital code from the TDC and output the second delay time corresponding to the M-bit digital code.

7. The pipeline ADC of claim 6, wherein the delay signal generator includes:
an S/H configured to sample and output a voltage signal in response to the clock signal output from the clock buffer;
a preamplifier configured to amplify the voltage signal output from the S/H and output the clock signal delayed by a delay time due to the amplification; and
a latch configured to receive the delayed clock signal from the preamplifier and output the delayed clock signal,
wherein the S/H, the preamplifier, and the latch included in the delay signal generator have the same characteristics as the S/H, the preamplifiers, and the latches included in the flash ADC.

8. The pipeline ADC of claim 7, wherein the delayed clock signal output from the delay signal generator has the same delay time as the signal output from the flash ADC.

9. The pipeline ADC of claim 6, wherein the TDC has a structure in which a plurality of unit delay cells, a plurality of latches, and a plurality of buffers are coupled to one thermometer encoder in multiple stages.

10. The pipeline ADC of claim 6, wherein the DTC has a structure in which a plurality of unit delay cells are coupled to a demultiplexer in multiple stages, and a buffer is coupled to an output terminal of the demultiplexer.

* * * * *